(12) United States Patent
Taguchi

(10) Patent No.: US 6,781,644 B1
(45) Date of Patent: Aug. 24, 2004

(54) LIQUID CRYSTAL DISPLAY WITH THIN FILM TRANSISTOR ARRAY FREE FROM SHORT-CIRCUIT AND PROCESS FOR FABRICATION THEREOF

(75) Inventor: Naoyuki Taguchi, Tokyo (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 536 days.

(21) Appl. No.: 09/583,530

(22) Filed: Jun. 1, 2000

(30) Foreign Application Priority Data

Jun. 2, 1999 (JP) .......................................... 11-154826

(51) Int. Cl.[7] ........................ G02F 1/1343; G02F 1/136
(52) U.S. Cl. ........................ 349/38; 349/43; 349/145; 349/146
(58) Field of Search .......................... 349/42, 43, 145, 349/146, 38

(56) References Cited

U.S. PATENT DOCUMENTS 5,872,021 A  2/1999  Matsumoto .................. 438/30
5,942,310 A * 8/1999  Moon ....................... 428/195.1
5,963,279 A  10/1999  Taguchi ....................... 349/54
6,025,892 A  2/2000  Kawai et al. ................. 349/43

FOREIGN PATENT DOCUMENTS

| | | |
|---|---|---|
| JP | 5-265039 | 10/1993 |
| JP | 7-199223 | 8/1995 |
| JP | 9-230376 A | 9/1997 |
| JP | 9-258244 A | 10/1997 |
| JP | 10-10583 A | 1/1998 |
| WO | 96/26463 | 8/1996 |

* cited by examiner

*Primary Examiner*—Dung Nguyen
(74) *Attorney, Agent, or Firm*—Foley & Lardner

(57) ABSTRACT

Pixels of a liquid crystal display are laid on a delta pattern, and short-circuit is liable to take place between a source layer and a drain layer and/or between a gate layer and a storage electrode layer, wherein a contact slit is formed in a gate insulating layer intervening between the gate/storage electrode layers and the source/drain layers in such a manner as to break a piece of residual amorphous silicon and make a piece of residual metal exposed thereto, and the piece of residual metal is broken during a patterning step for the source/drain layers.

9 Claims, 23 Drawing Sheets

LIQUID CRYSTAL DISPLAY WITH THIN
FILM TRANSISTOR ARRAY FREE FROM
SHORT-CIRCUIT AND PROCESS FOR
FABRICATION THEREOF

FIELD OF THE INVENTION

This invention relates to a liquid crystal display and, more particularly, to a thin film transistor array incorporated therein and a process of fabrication.

DESCRIPTION OF THE RELATED ART

A typical example of the thin film transistor array is incorporated in a liquid crystal display. The thin film transistors of the array are associated with pixel electrodes, and selectively turns on and off so as to electrically connect the data lines to the associated pixels. The thin film transistor and the associated pixel electrode form in combination a pixel.

In this application, the drain pattern and the pixel electrodes are formed on a gate insulating layer shared between the thin film transistors of the pixels. The pixels are arranged in rows, and the pixel electrodes in each row are arranged at predetermined pitches. The pixel electrodes in a row are offset from the pixel electrodes in the next row by a half of the pitch. The pixels are laid on what people call "delta pattern". The array of thin film transistors laid on the delta pattern has a drain pattern, a gate pattern and a storage pattern. These patterns are in proximity to one another, and are liable to be short circuited and/or capacitively coupled to each other. Especially, when the array of thin film transistors includes the pattern formed of amorphous silicon, residual amorphous silicon is liable to be left after the patterning step. The residual amorphous silicon is causative of the short-circuit between the drain pattern and the pixel electrode and/or between the adjacent pixel electrodes. If the residual amorphous silicon is left in the gap between the delta drain pattern and the source pattern parallel to each other, the short-circuit similarly takes place therebetween. The short-circuit results in a point defect.

If the patterns such as the drain lines and the pixel electrodes are spaced from each other, the wide gap prevents the patterns from the short-circuit. However, such a wide gap forces the designer to make the pixel electrodes narrower, and, accordingly, the aperture ratio is decreased. Moreover, the small aperture ratio results in a low transmittance of the screen. Thus, the wide gap is not a good solution against the short-circuit due to the residual amorphous silicon and residual metal.

Another prior art liquid crystal display is disclosed in Japanese Patent Publication of Unexamined Application (laid-open) No. 7-199223. The prior art liquid crystal display disclosed in the Japanese Patent Publication of Unexamined Application is hereinbelow referred to as "first prior art liquid crystal display". FIG. 1 shows the layout of one example of the first prior art liquid crystal display. FIG. 2 shows the cross section taken along line F–F', FIG. 3 shows the cross section taken along line G–G', and FIG. 4 shows the delta pattern of thin film transistor array enclosed by broken lines H.

On a glass substrate 1 is patterned a gate layer 2, which is covered with a gate insulating layer 3 of $SiN_x/SiO_x$. An intrinsic amorphous silicon layer 4 and a heavily-doped n-type amorphous silicon layer 5 are formed on the gate insulating layer 3, and a contact slit 6 is formed in such a manner as to reach the glass substrate 1. A source pattern 7 and a drain pattern 8 are defined, and the source pattern 7 is partially overlapped with a transparent pixel electrode 9. The source pattern 7, the drain pattern 8, the transparent pixel electrode 9 and the exposed surface of the intrinsic amorphous silicon layer 4 are covered with a protective dielectric layer 10.

There remains neither residual amorphous silicon nor residual alloy in the pattern shown in FIG. 4. However, a piece of residual amorphous silicon 14 and a piece of residual alloy 15 may be left on the pattern in the fabrication process as shown in FIG. 5. The piece of residual amorphous silicon 14 and the piece of alloy 15 are causative of short-circuits. The Japanese Patent Publication of Unexamined Application teaches that the gate insulating layer 3 between the area assigned to the drain pattern 8 and the area assigned to the transparent pixel electrodes 9 is selectively etched away so as to form the contact slit 6.

FIG. 6 shows the layout of another example of the first liquid crystal display. FIG. 7 shows the cross section taken along line I–I', FIG. 8 shows another cross section taken along line J–J', and FIG. 9 shows the delta pattern of thin film transistor array enclosed in broken line K. The layers and patterns of the other example are labeled with the same references designating corresponding layers and patterns incorporated in the example of the first prior art liquid crystal display.

There is neither residual amorphous silicon nor residual alloy on the delta pattern shown in FIG. 9. However, a piece of amorphous silicon 14 and a piece of alloy 15 may be left on the delta pattern in the fabrication process as shown in FIG. 10. Even if the piece of residual amorphous silicon 14 and the piece of residual alloy 15 are left on the area between the drain pattern 8 and the transparent pixel electrodes 9 and/or the area between the adjacent transparent pixel electrodes 9, the piece of residual amorphous silicon 14 and the piece of residual alloy 15 are removed during the etching step, and the other example is prevented from the short-circuit due to the piece of residual amorphous silicon 14 and the piece of residual alloy 15.

Yet another prior art liquid crystal display is disclosed in Japanese Patent Application No. 8-525570. The prior art liquid crystal display disclosed therein is hereinbelow referred to as "second prior art liquid crystal display". FIG. 11 shows the layout of the second prior art. FIG. 12 shows a cross section taken along line L—L of FIG. 11, FIG. 13 shows another cross section taken along line M—M of FIG. 11, and FIG. 14 shows the delta pattern of thin film transistor array enclosed in broken line N. The layers and patterns of the second prior art liquid crystal display are labeled with the same references designating corresponding layers and patterns of the example of the first prior art liquid crystal display. A storage pattern 12 is further incorporated in the second prior art liquid crystal display, and a slit 16 is formed in the protective dielectric layer 10. A piece of residual amorphous silicon 14 and a piece of residual transparent alloy may be left on the delta pattern as shown in FIG. 15.

The fabrication process for the second prior art liquid crystal display includes the step of forming the slit 16. Even if the piece of residual amorphous silicon 14 and the piece of residual alloy 15 are left on the area between the drain pattern 8 and the transparent pixel electrode 9 and/or the area between the adjacent transparent pixel electrodes 9, the piece of residual amorphous silicon 14 and the piece of residual alloy are etched away in the patterning step. Thus, the second prior art liquid crystal display is prevented from the short-circuit due to the piece of residual amorphous silicon 14 and/or the piece of residual alloy 15.

Following problems are encountered in the above-described prior art liquid crystal displays. The contact slit 6 is a particular feature of the delta pattern of the example of the first prior art liquid crystal display, and is formed around the pixel electrodes 9. The contact slit 6 extends between the drain pattern 8 and the pixel electrode 9, and is effective against the short-circuit therebetween due to the piece of amorphous silicon as shown in FIG. 5. However, the contact slit 6 can not prevent the drain pattern 8 and the source pattern 7 from the short-circuit. This is because of the fact that the source pattern 7 extends in parallel to the drain pattern 8 without any contact slit 6 therebetween. As to the thin film transistors arranged in the delta pattern shown in FIG. 10, the storage pattern 12 is in parallel to the gate layer 2, and is liable to be short circuited with the gate layer 2 due to the piece of residual metal 15.

The second prior art liquid crystal display is featured by the slit 16 formed in the protective dielectric layer 10. The slit 16 is also formed around the pixel electrode 9, and, accordingly, is effective against the short-circuit between the drain pattern 8 and the pixel electrode 9 as shown in FIG. 15. However, the slit 16 can not prevent the drain pattern 8 and the source pattern 7 from the short-circuit. Moreover, the slit 16 is terminated at the upper surface of the gate insulating layer 3, and can not prevent the gate layer 2 and the storage pattern 12 from the short-circuit as similar to the other example of the first prior art liquid crystal display.

Thus, both slits 6 and 16 can not perfectly prevent the conductive patterns 2/7/8/9/12 from short-circuit due to the pieces of residual conductive material 14/15.

SUMMARY OF THE INVENTION

It is therefore an important object of the present invention to provide a liquid crystal display which is free from the problems due to the pieces of residual conductive material.

It is also an important object of the present invention to provide a process for fabricating the liquid crystal display.

To accomplish the object, the present invention proposes to form contact slits between a gate pattern and a drain pattern and between a gate pattern and a storage pattern.

In accordance with one aspect of the present invention, there is provided a liquid crystal display comprising a substrate, and an array of pixels arranged in a delta pattern on the substrate and including a thin film transistor array having a gate pattern having plural gate layers formed on a major surface of the substrate, a gate insulating layer covering the gate pattern and a remaining area of the major surface, amorphous silicon layers formed on the gate insulating layers over the gate layers for providing conductive channels, a source pattern having plural source layers formed on the gate insulating layer and held in contact with the associated amorphous silicon layers, respectively, and a drain pattern having plural drain layers formed on the gate insulating layer, held in contact with the associated amorphous silicon layers, respectively, and spaced from the associated source layers and from the source layers of adjacent thin film transistors of the thin film transistor array by first regions of the gate insulating layer, respectively, plural transparent pixel electrodes formed on the gate insulating layer and connected to the source layers, respectively and storage electrode layers formed on the major surface and spaced from the gate layers by second regions of the gate insulating layer, and contact slits are form in the gate insulating layer and selectively extending through the first regions and the second regions so as to expose parts of said major surface under the second regions thereto.

In accordance with another aspect of the present invention, there is provided a process for fabricating a liquid crystal display comprising the steps of preparing a substrate having a major surface, patterning a first conductive material layer into plural gate layers and plural storage electrode layers on the major surface, covering the plural gate layers and the plural storage electrode layers with a gate insulating layer, patterning an amorphous silicon layer into plural amorphous silicon layers on the gate insulating layer, selectively etching the gate insulating layer together with a piece of residual amorphous silicon connected between two of the plural amorphous silicon layers, if any, for forming contact slits in the gate insulating layer, a piece of conductive material between one of the plural gate layers and an adjacent storage electrode layer being exposed to one of the contact slits, if any, patterning a second conductive material layer into plural drain layers and plural source layers, the piece of conductive material being split during the pattering of the second conductive material layer, patterning a transparent material layer into pixel electrodes respectively held in contact with the plural source layers, and completing the liquid crystal display.

BRIEF DESCRIPTION OF THF DRAWINGS

The features and advantages of the liquid crystal display and the process will be more clearly understood from the following description taken in conjunction with the accompanying drawings in which.

DESCRIPTION OF THE PREFERRED EMBODIMENTS

First Embodiment

Figure 1:
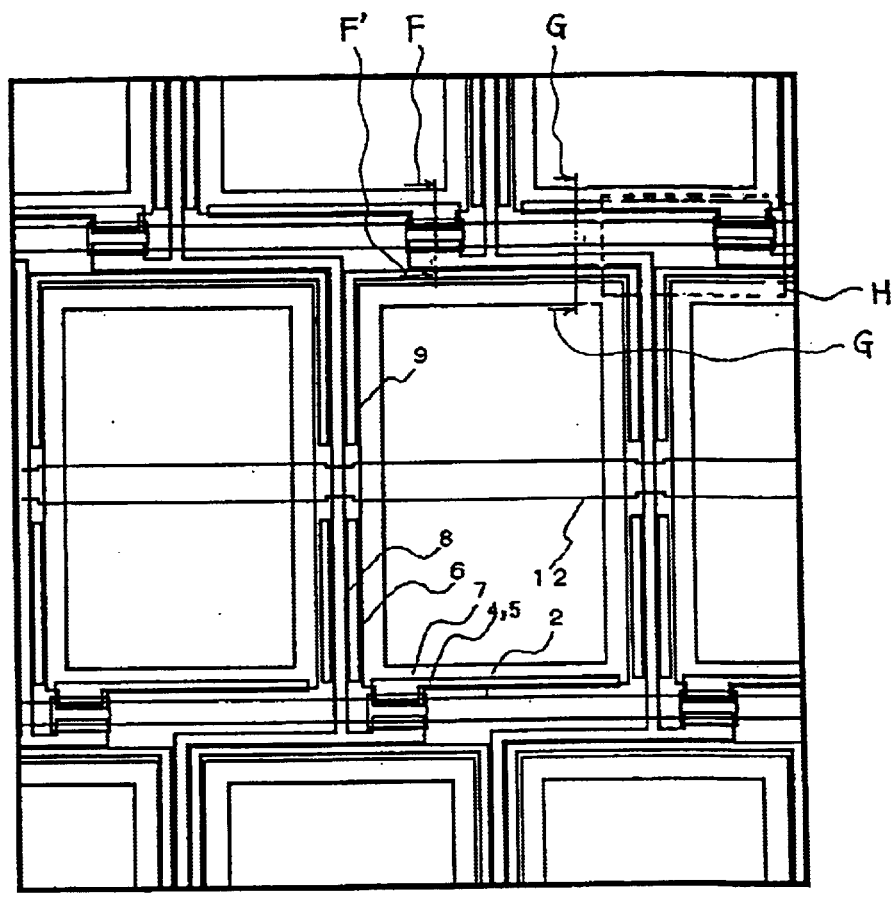
FIG. 1 is a view showing the layout of one example of the first prior art liquid crystal display.
Figure 2:
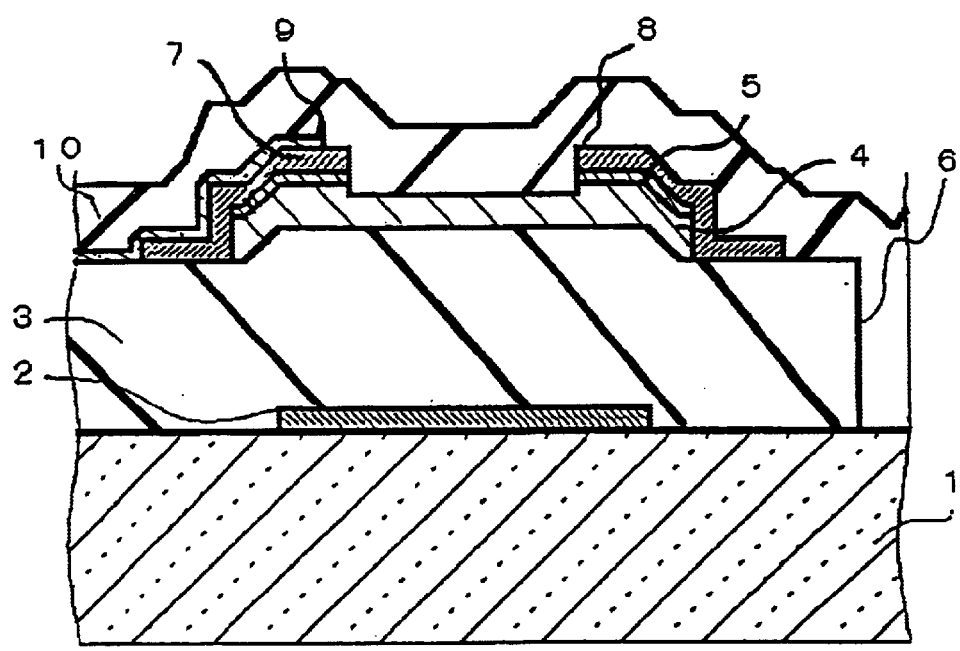
FIG. 2 is a cross sectional view taken along line F–F' of FIG. 1 and showing the structure of the first prior art liquid crystal display.
Figure 3:
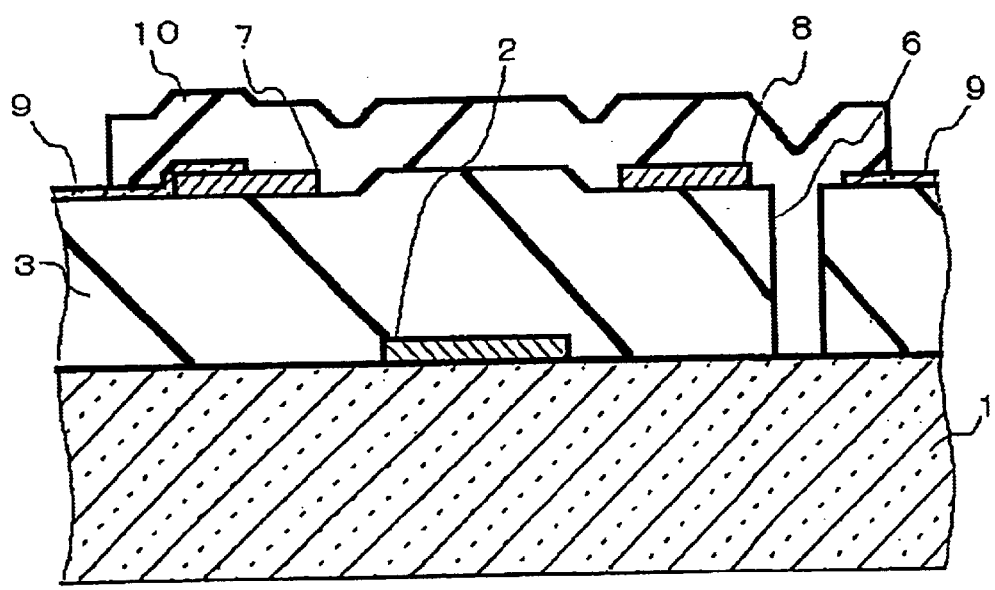
FIG. 3 is a cross sectional view taken along line G–G' of FIG. 1 and showing the structure of the first prior art liquid crystal display.
Figure 4:
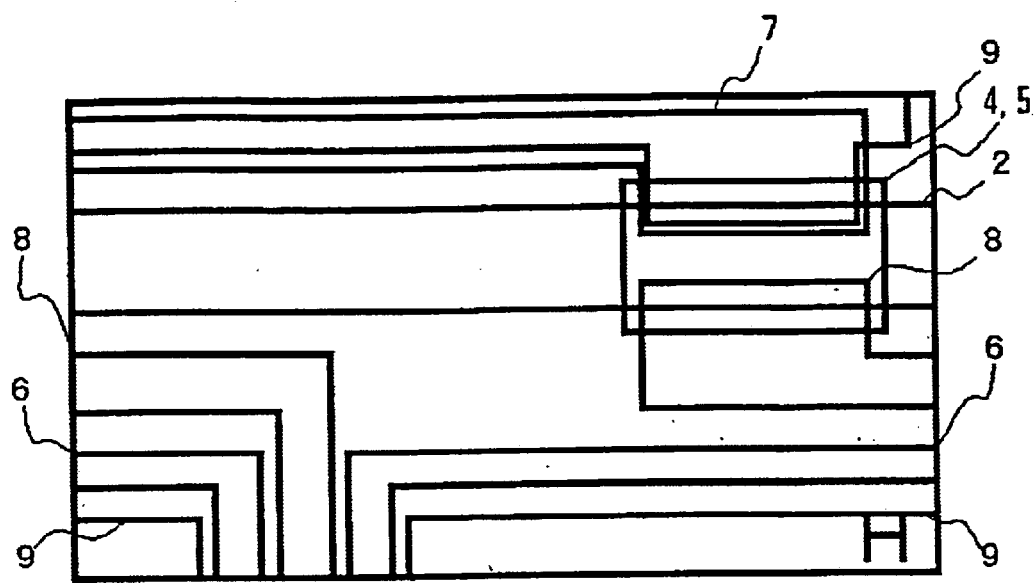
FIG. 4 is a view showing the delta pattern of the first prior art liquid crystal display encircled in broken line H in FIG. 1.
Figure 5:
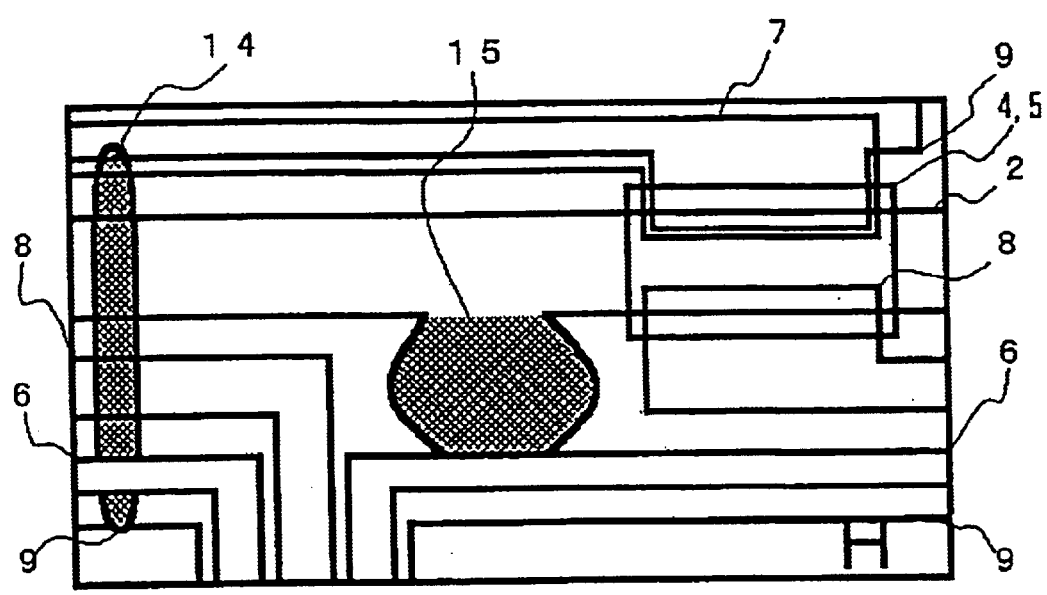
FIG. 5 is a view showing the piece of residual amorphous silicon and the piece of residual alloy left on the delta pattern shown in FIG. 4.
Figure 6:
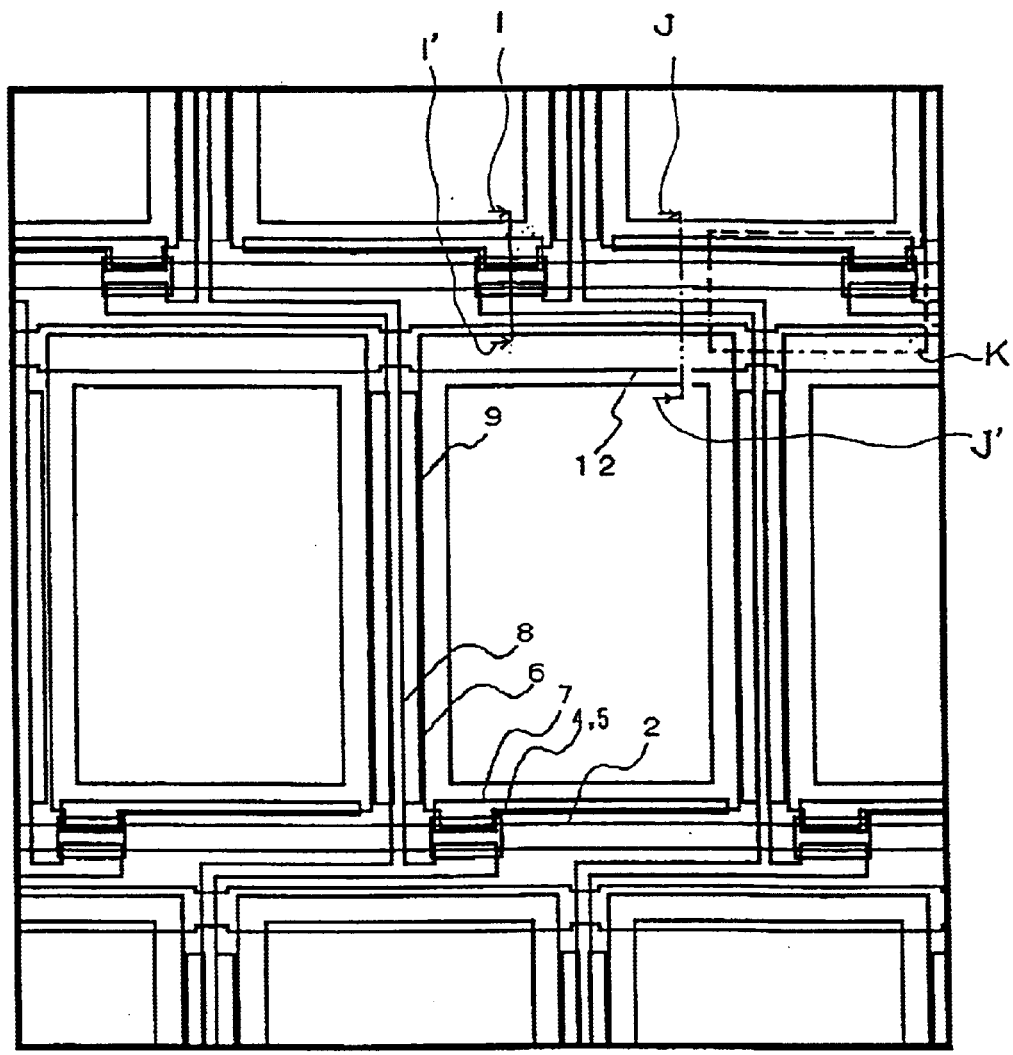
FIG. 6 is a view showing the layout of another example of the first prior art liquid crystal display.
Figure 7:
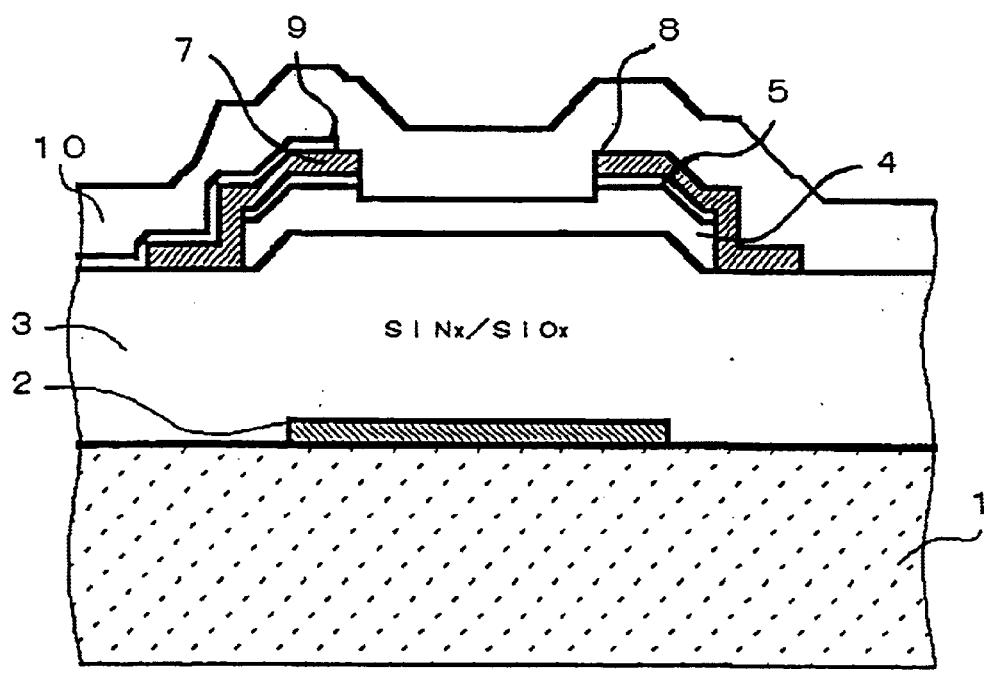
FIG. 7 is a cross sectional view taken along line I–I' of FIG. 6 and showing the structure of the other example.
Figure 8:
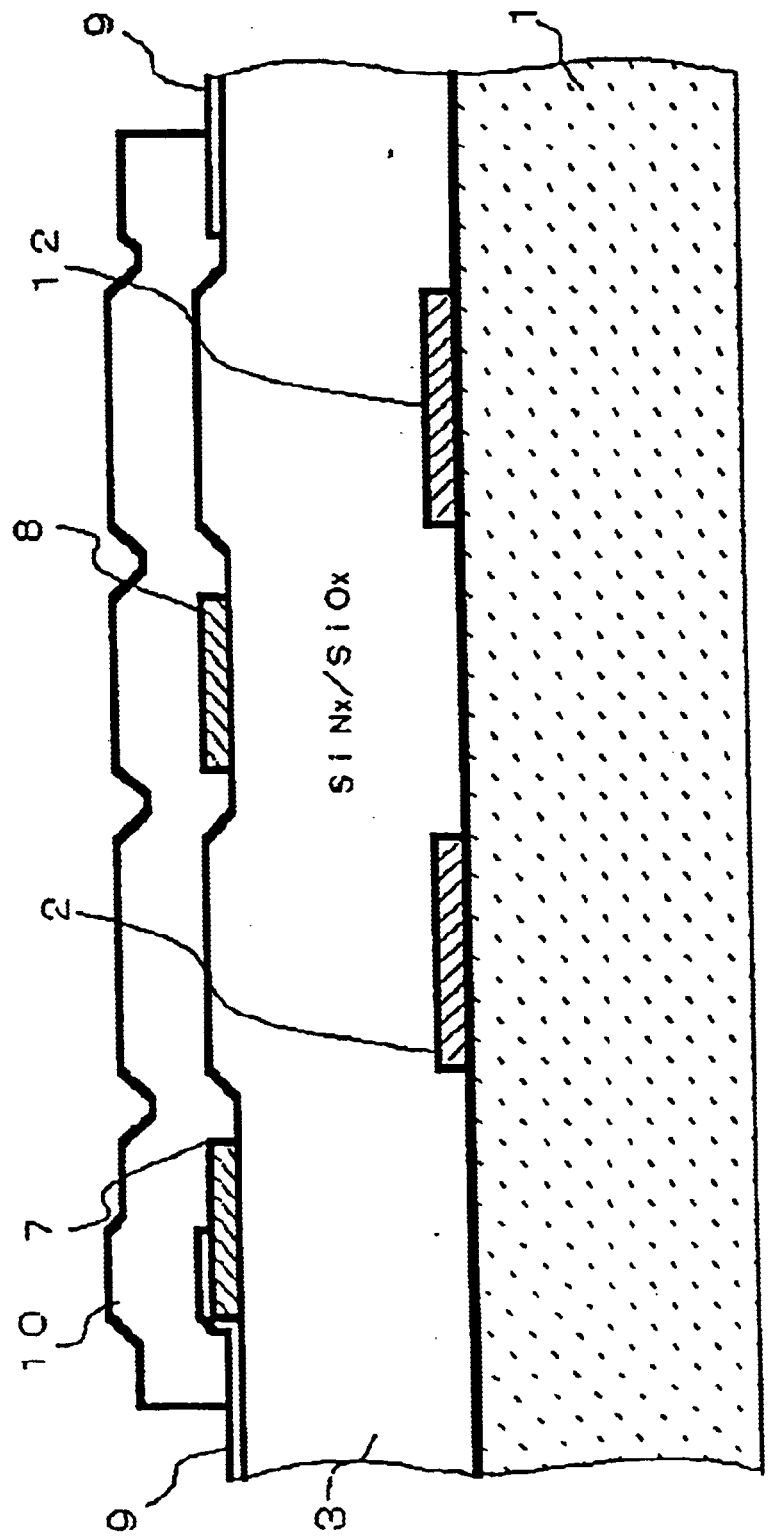
FIG. 8 is a cross sectional view taken along line J–J' of FIG. 6 and showing the structure of the other example.
Figure 9:
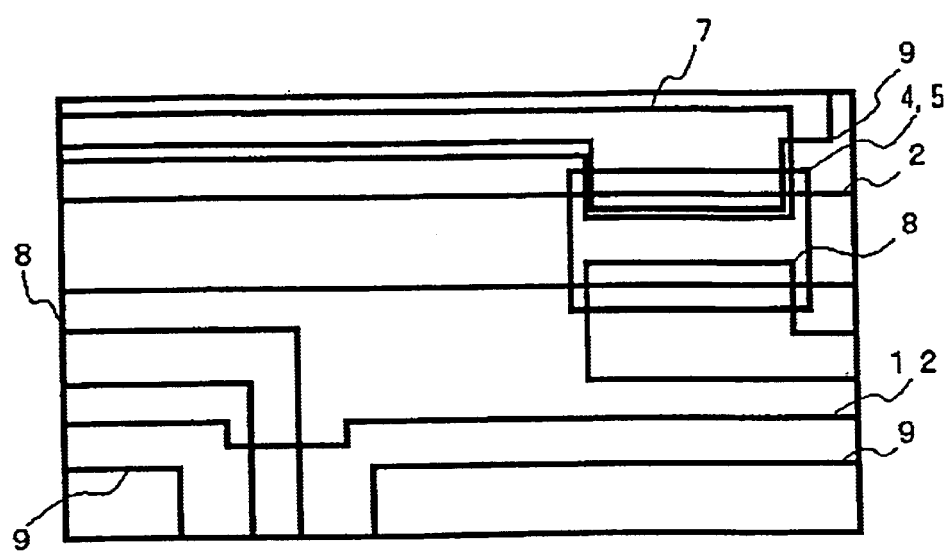
FIG. 9 is a view showing the delta pattern of the other example encircled in broken line K in FIG. 6.
Figure 10:
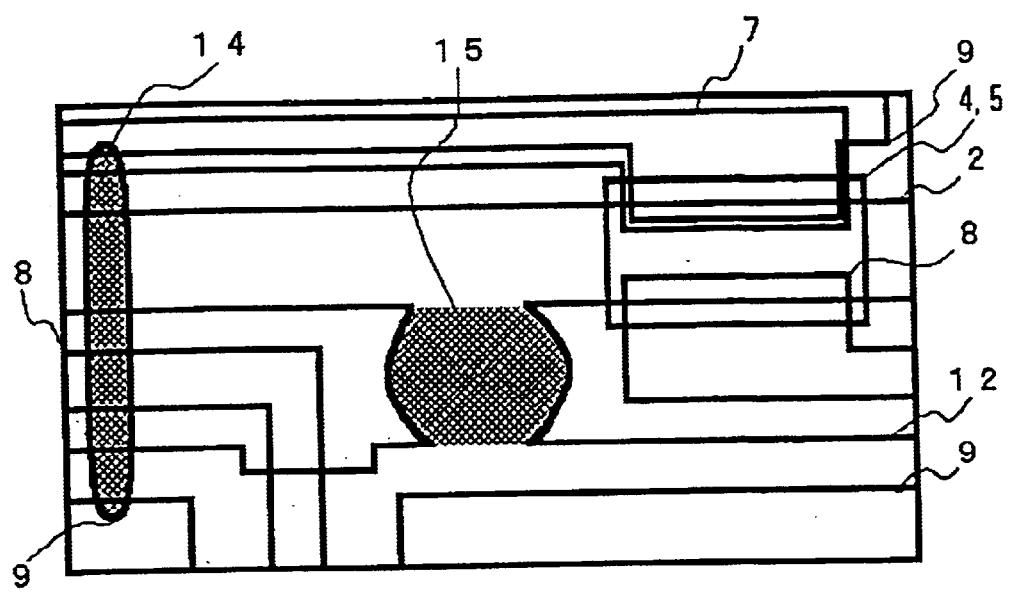
FIG. 10 is a view showing the piece of residual amorphous silicon and the piece of residual alloy left on the delta pattern shown in FIG. 9.
Figure 11:
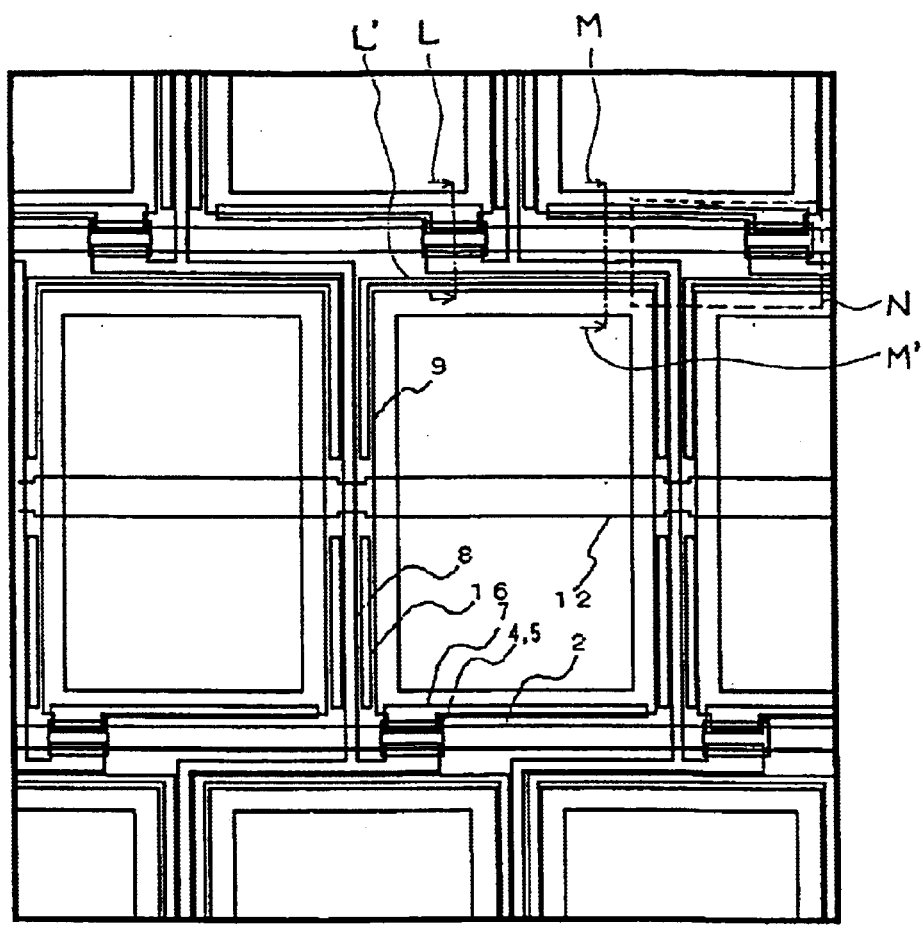
FIG. 11 is a view showing the layout of the second prior art liquid crystal display.
Figure 12:
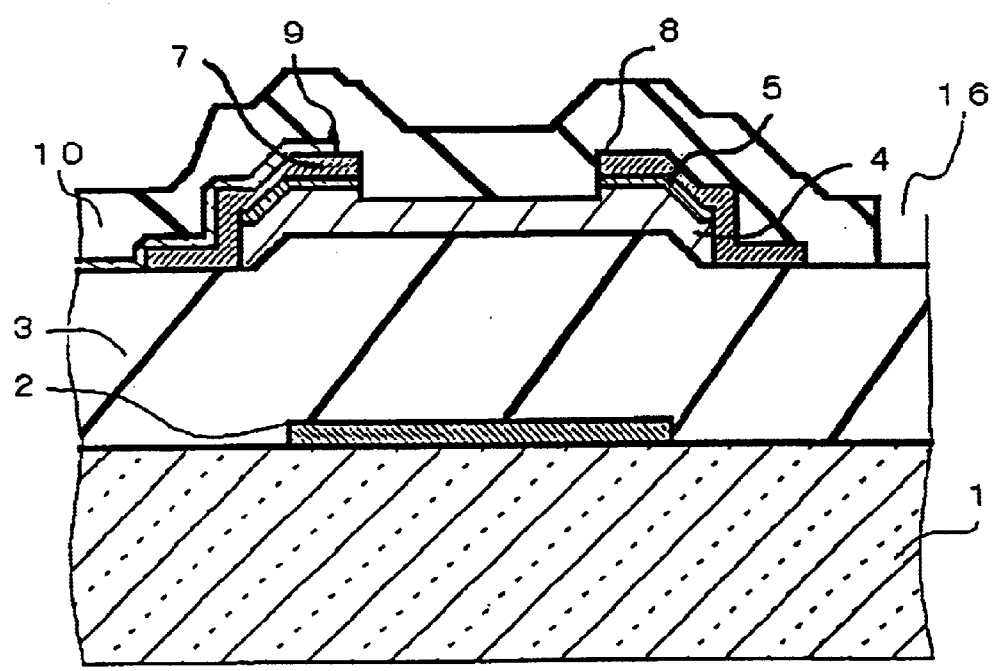
FIG. 12 is a cross sectional view taken along line L–L' of FIG. 11 and showing the structure of the second prior art liquid crystal display.
Figure 13:
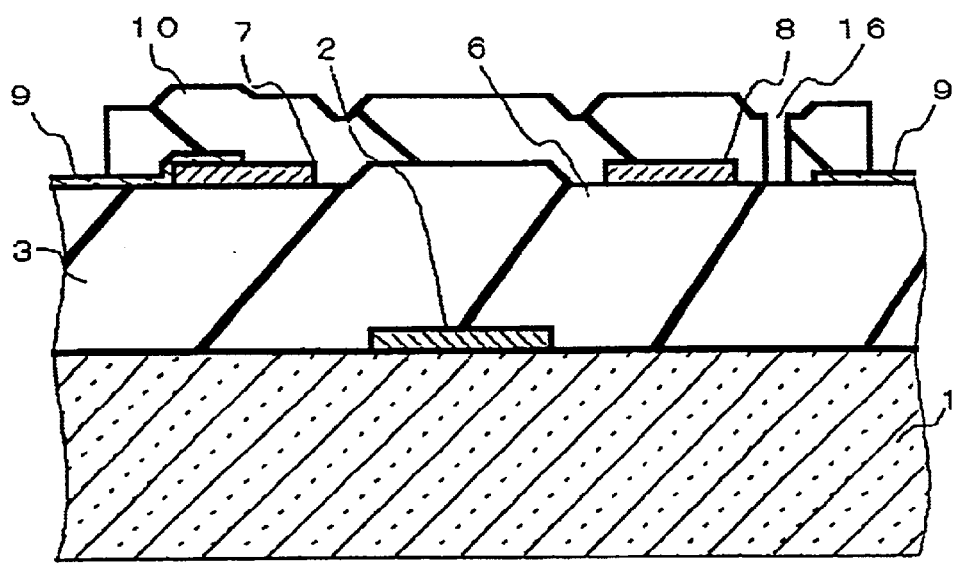
FIG. 13 is a cross sectional view taken along line M–M' of FIG. 11 and showing the structure of the second prior art liquid crystal display.
Figure 14:
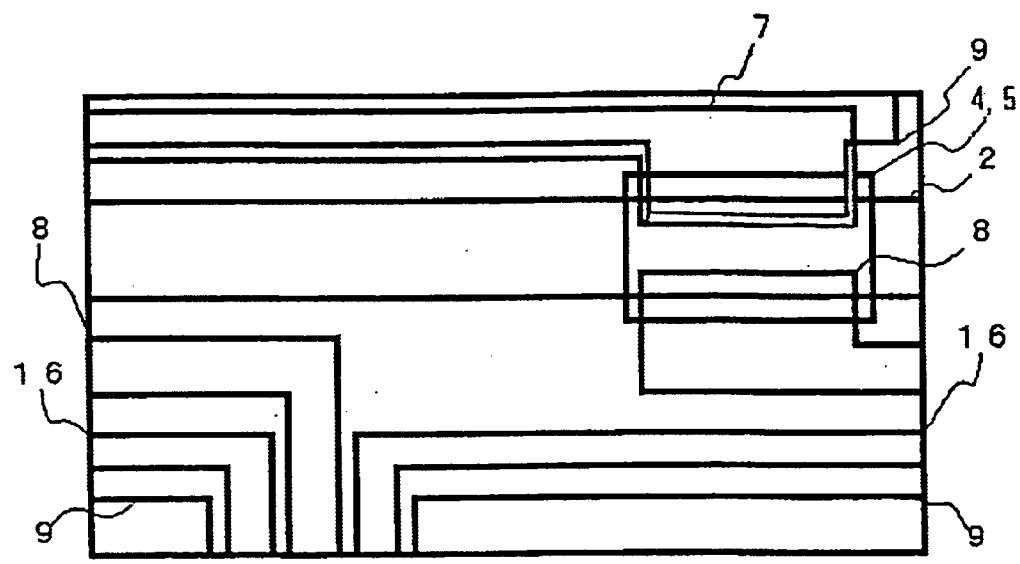
FIG. 14 is a view showing the delta pattern of thin film transistors encircled in broken line N in FIG. 11.
Figure 15:
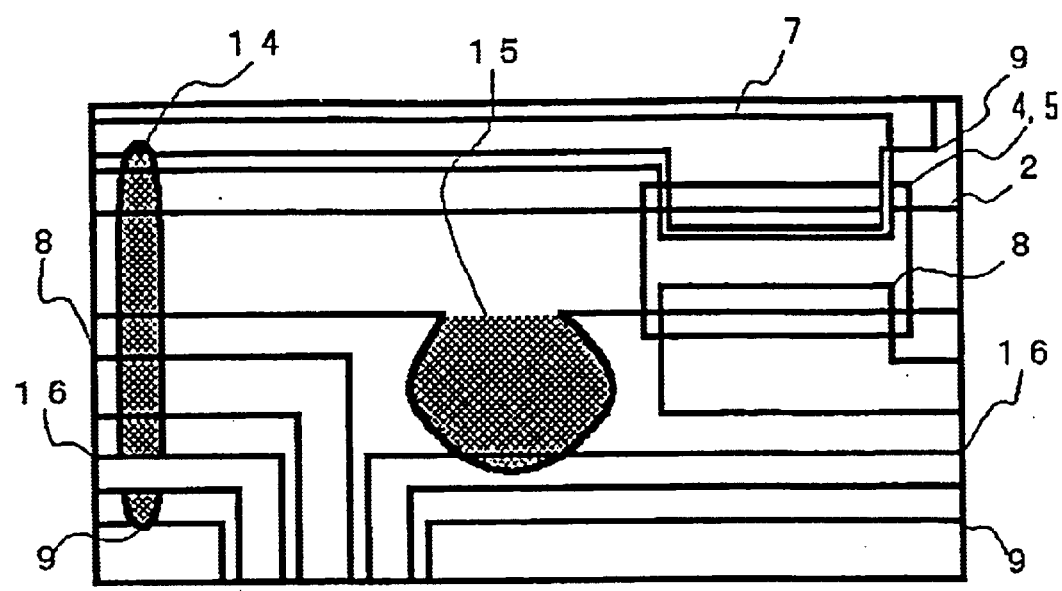
FIG. 15 is a view showing the piece of residual amorphous silicon and the piece of residual alloy left on the delta pattern shown in FIG. 14.
Figure 16:
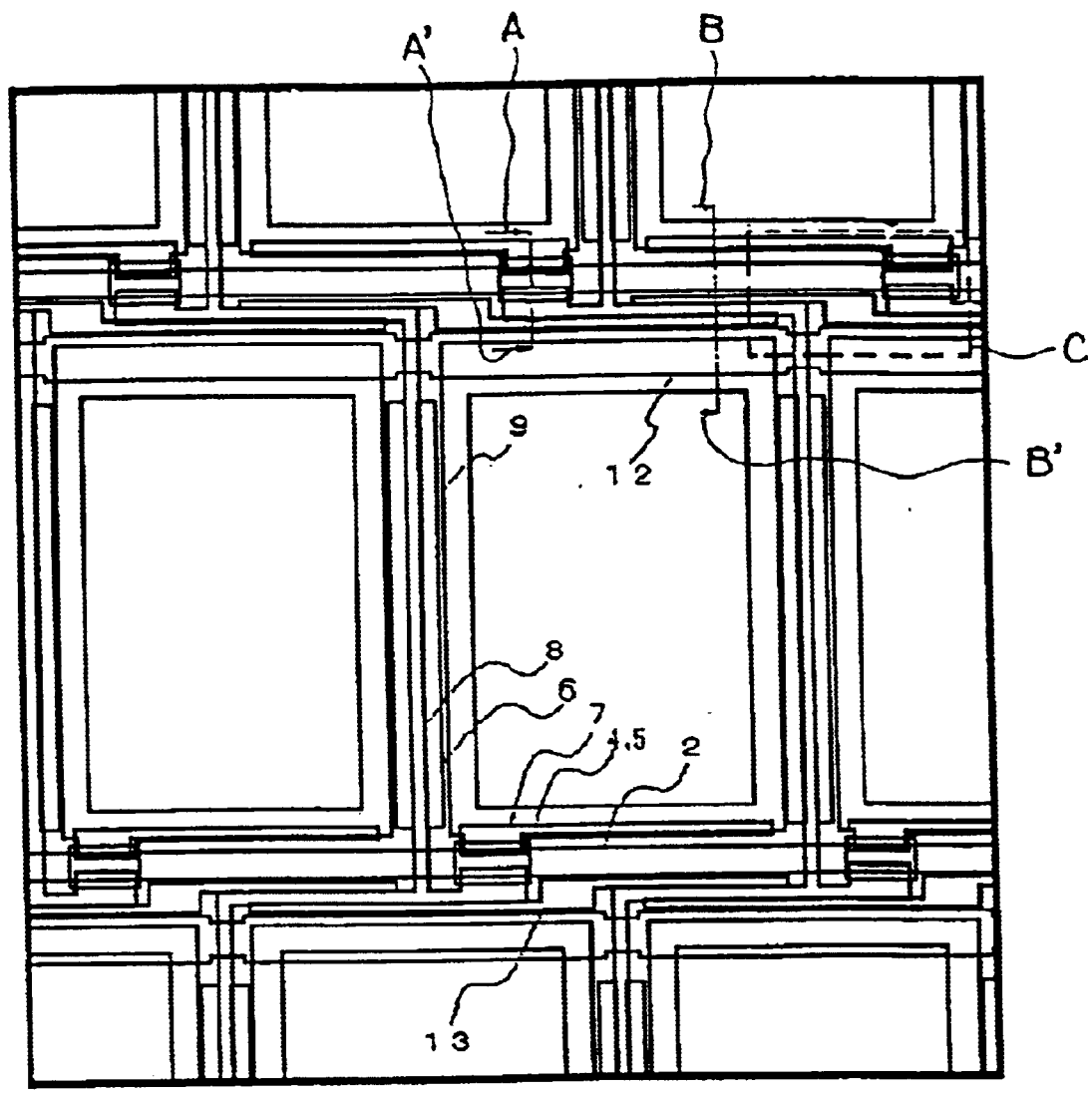
FIG. 16 is a view showing the layout of a liquid crystal display according to the present invention.
Figure 17:
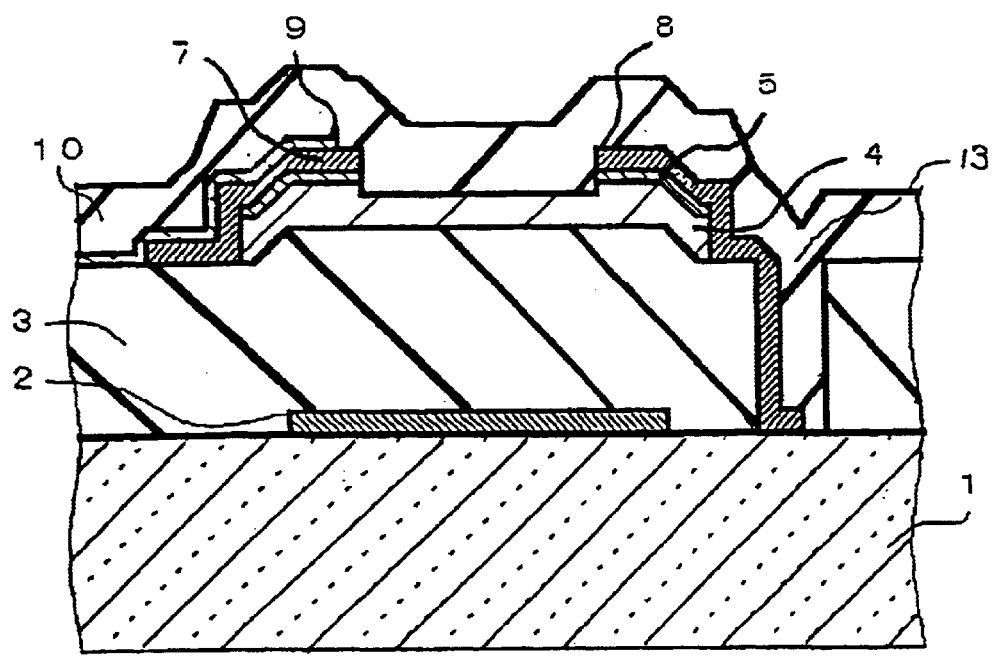
FIG. 17 is a cross sectional view taken along line A–A' of FIG. 16 and showing the structure of the liquid crystal display.
Figure 18:
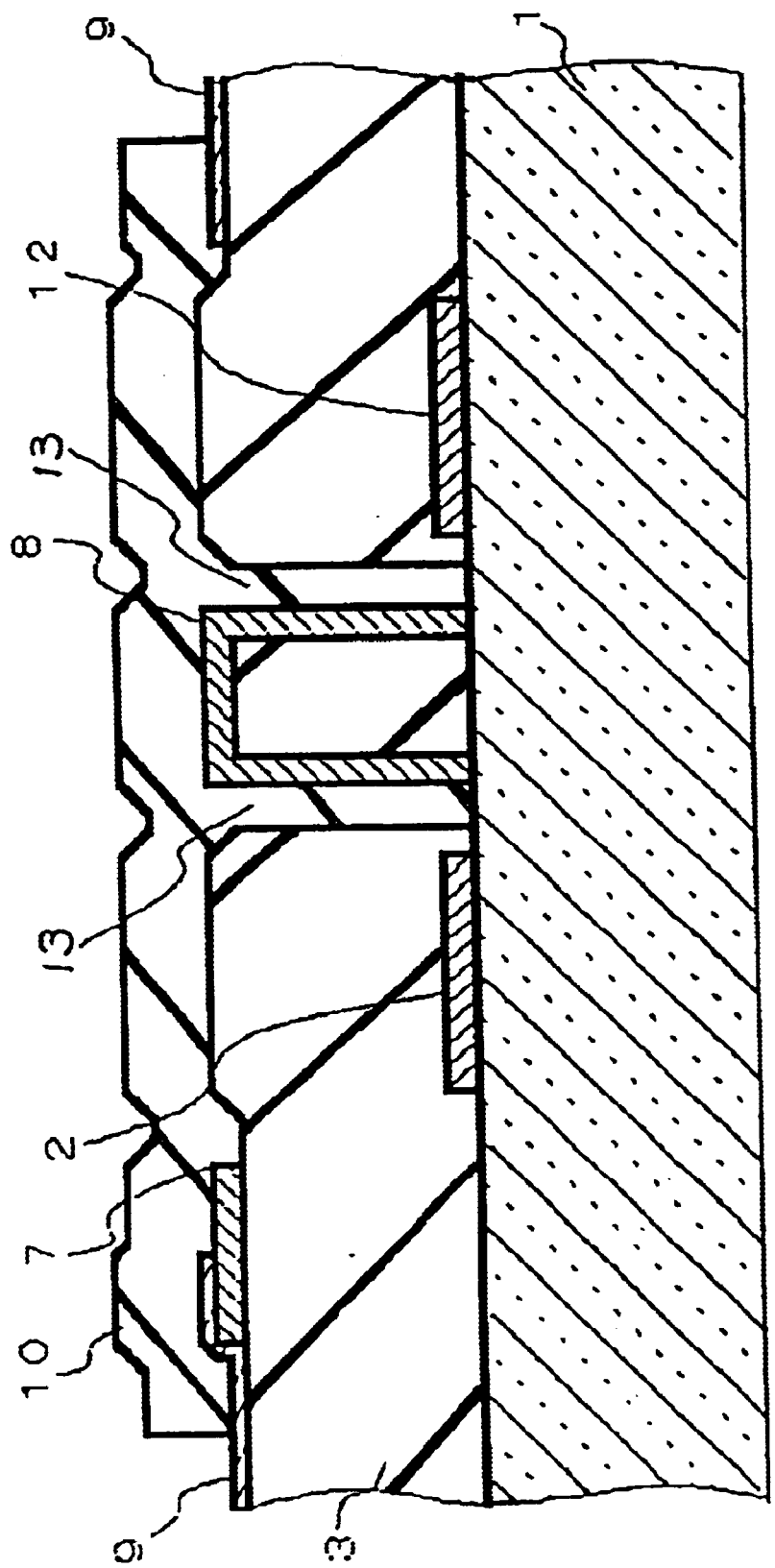
FIG. 18 is a cross sectional view taken along line B–B' of FIG. 16 and showing the structure of the liquid crystal display.
Figure 19:
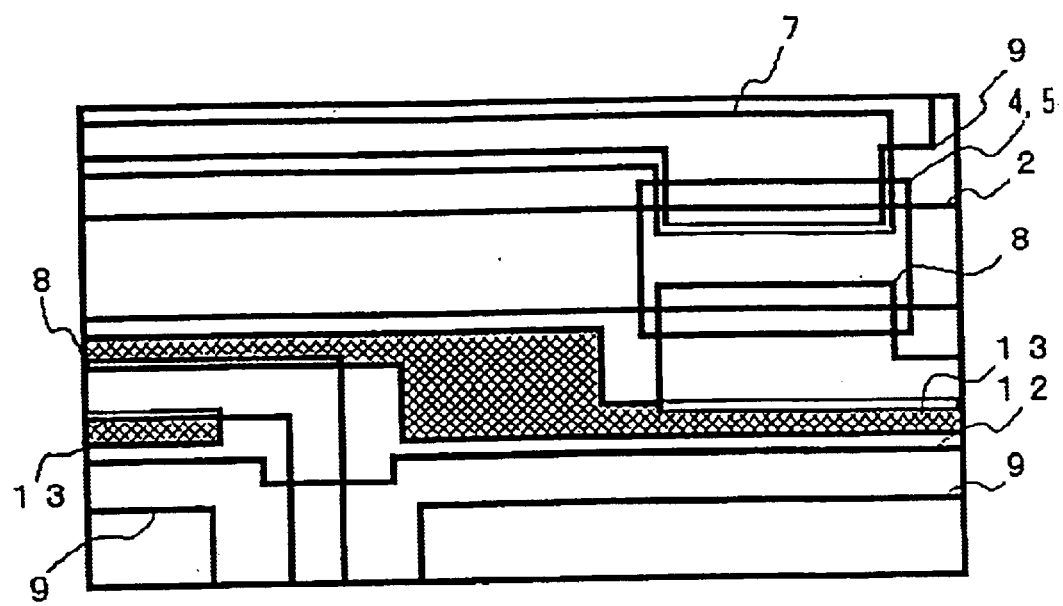
FIG. 19 is a view showing a delta pattern of the liquid crystal display encircled in broken line C.

Referring to FIG. 16 of the drawings, an array of thin film transistors is arranged in the delta pattern. The thin film transistor array is incorporated in a liquid crystal display. FIG. 17 shows the cross section taken along line A–A' of FIG. 16, and FIG. 18 shows another cross section taken along line B–B' of FIG. 16. A part of the thin film transistor array is encircled in broken line C, and is shown in FIG. 19. In FIGS. 16 to 19, reference numeral 1 designates a glass substrate. As described in conjunction with the prior art liquid crystal displays, a thin film transistor and a pixel electrode form each of the pixels. The pixels are arranged in rows at predetermined pitches, and the pixels in a row are offset from the pixels in the next row by a half of the predetermined pitch. Thus, the pixels are laid on the delta pattern.

Gate layers 2 and storage electrode layers 12 are formed on the major surface of the glass substrate 1. The gate layers 2 and the storage electrode layers 12 are covered with a gate insulating layer 3, and contact slits 6 and bent contact slits 13 are formed in the gate insulating layer 3. The contact slits 6 and the bent contact slits 13 penetrate through the gate insulating layer 3, and reach the major surface of the glass substrate 1. The contact slits 6 and the bent contact slits 13 are appropriately located, and prevent conductive patterns from short-circuit as will be hereinlater described in detail.

Intrinsic amorphous silicon layers 4 are formed on the gate insulating layer 3, and heavily-doped n-type amorphous silicon layers 5 are laminated on both side areas of each intrinsic amorphous silicon layer 4. Source layers 7 and drain layers 8 are held in contact with the heavily-doped n-type amorphous silicon layers 5, and the source layers 7 are spaced from the associated drain layers 8, respectively. Transparent pixel electrodes 9 are held in contact with the source layers 7 and the intrinsic amorphous silicon layers 4. The source layers 7, the drain layers 8, and the transparent pixel electrodes 9 are covered with a protective dielectric layer 10. The gate insulating layer 3, storage electrode layers 12, and the associated transparent pixel electrodes 9 form in combination storage capacitors coupled to the pixels, respectively.

The delta pattern has a part of the drain layer 8 in parallel to a part of the gate layer 2, and the part of the drain layer 8 and the part of the gate layer 2 are in proximity with each other. The storage electrode layer 12 is overlapped with the transparent pixel electrodes 9 because of a large aperture ratio. As a result, the gate layer 2, the drain layer 8 and the storage electrode layer 12 are partially in parallel to and in proximity with one another. The bend contact slit 13 extends from the region between the part of the gate layer 2 and the part of the drain layer 8 to the region between the storage electrode layer 12 and the drain pattern 8 in parallel thereto as shown in FIG. 19.

The bent contact slit 13 is desirable from the aspect not to allow a piece of residual amorphous silicon and a piece of residual metal to form short-circuits between the conductive layers 2 and 8 and/or 8 and 12. Even if a piece of residual amorphous silicon was left over the gate layer 2 and the drain layer 8, a part of the piece of residual amorphous silicon is etched away together with a piece of gate insulating layer 3 while a kind of etchant is forming the bent contact slits 13 in the gate insulating layer 3. After the formation of the bent contact slits 13, the drain layers 8 are patterned. Even if a piece of residual metal was left between the gate layer 2 and the storage electrode layer 12, a part of the piece of residual metal is exposed to the bent contact slit 13, and is etched away in the etching step for the drain layers 8. Thus, the piece of residual amorphous silicon is split into pieces of residual amorphous silicon in the patterning step for the bent contact slit 13, and the piece of residual metal is split into pieces of residual metal in the patterning step for the drain layers 8. This results in that the bent contact slits 13 are effective against short-circuit between the gate layer 2 and the drain layer 8 and short-circuit between the gate layer 2 and the storage electrode layer 12. The bent contact slit 13 is the combination of the slit in the previous stage and the slit in the next stage, and, accordingly, pieces of residual amorphous silicon on most area are split in the etching step. Pieces of residual metal are always exposed to the bent contact slits 13, and are split in the patterning step for the drain layers 8.

The thin film transistor array is fabricated on the glass substrate 1 as follows with reference to FIGS. 17, 18 and 19. First, chromium is deposited over the major surface of the glass substrate 1 by using a sputtering, and the chromium layer is patterned into the gate layers 2 and the storage electrode layers 2 in proximity therewith through a photolithography followed by an etching.

Insulating material such as $SiN_x/SiO_x$, intrinsic amorphous silicon and heavily-doped n-type amorphous silicon are successively deposited over the gate layers 2 and the storage electrode layers 12 by using a plasma-assisted chemical vapor deposition. The insulating material forms the gate insulating layer 3, and the intrinsic amorphous silicon and the heavily-doped n-type amorphous silicon form an intrinsic amorphous silicon layer formed over the gate insulating layer 3 and a heavily-doped n-type amorphous silicon layer laminated on the intrinsic amorphous silicon layer, respectively. The heavily-doped n-type amorphous silicon layer and the intrinsic amorphous silicon layer are patterned into heavily-doped n-type amorphous silicon layers and the intrinsic amorphous silicon layers thereunder.

Subsequently, the gate insulating layer 3 is selectively etched away for connection between the source/drain layers 7/8 and peripheral terminals (not shown). In this step, the bent contact slits 13 and the contact slits 6 are formed in the gate insulating layer 3. The bent contact slit 13 extends from between the gate layers 2 and the area assigned to the drain layer 8 through between the storage electrode layer 12 and the area assigned to the drain layer 8. The contact slit 6 is formed between the area assigned to the transparent pixel electrode 9 and the area assigned to the drain layer 8. While a kind of etchant is selectively removing the gate insulating layer 3, pieces of residual amorphous silicon are split into plural pairs of pieces of residual amorphous silicon, and the source layers 7 are disconnected from the drain layers 8.

Subsequently, chromium, molybdenum-tantalum or aluminum/tantalum is deposited over the entire surface of the resultant structure so as to form a single or plural conductive layers. The single/plural conductive layers are patterned into the source layers 7 and the drain layers 8 by using the photo-lithography and the etching. If pieces of residual metal are left on the area between the gate layers 2 and the storage electrode layers 12, the etchant splits the pieces of residual metal into pairs of pieces of residual metal, and the gate layers 2 are disconnected from the storage electrode layers 12.

Subsequently, conductive transparent material such as ITO is deposited over the entire surface of the resultant structure, and the conductive transparent layer is patterned into the transparent pixel electrodes 9. After the patterning, the heavily-doped n-type amorphous silicon layers and the intrinsic amorphous silicon layers are selectively etched away by using a dry etching, and channel regions of the intrinsic amorphous silicon layers are exposed to the gaps between the source layers 7 and the drain layers 8.

Finally, dielectric material is deposited over the entire surface of the resultant structure, and forms the protective dielectric layer 10.

Figure 20:
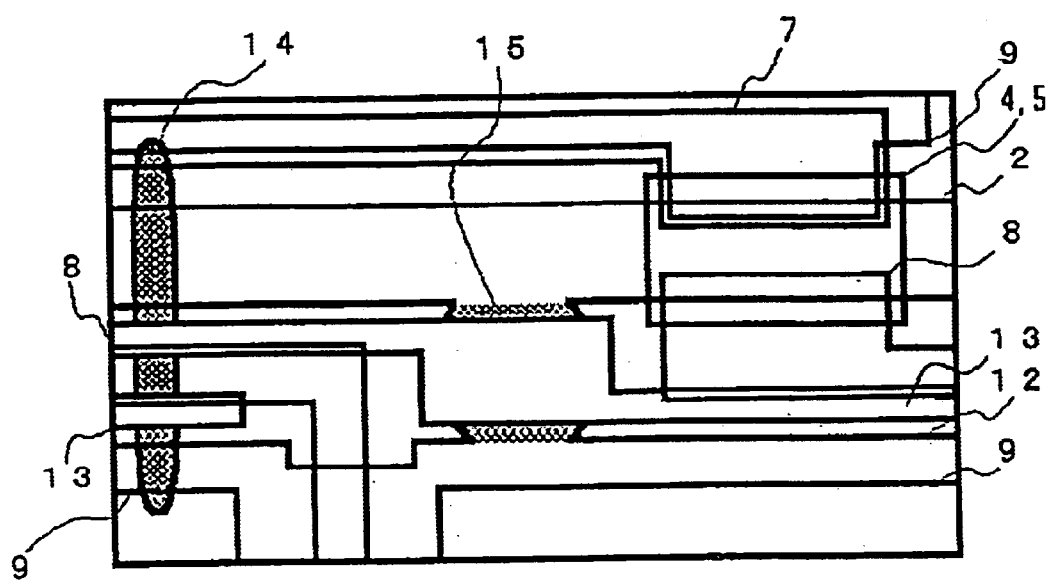
FIG. 20 is a view showing pieces of residual conductive material left in the delta pattern.

As will be understood from the foregoing description, the bent contact slits 13 are effective against the short-circuit between the source layers 7 and the drain layers 8 and between the gate layers 2 and the storage electrode layers 12. A piece of residual amorphous silicon 14 is liable to be left during the patterning step for the heavily-doped n-type amorphous silicon layers, and a piece of residual metal 15 is left during the patterning step for the gate/storage electrode layers 2/12 (see FIG. 20). Even so, while the bent contact slits 13 are being formed in the gate insulating layer 3, the piece of residual amorphous silicon 14 is split into pieces, and the piece of residual metal 15 is exposed to the bent contact slit 13. The piece of residual metal 15 is also broken during the patterning step for the source/drain layers 7/8. Thus, the bent contact slits 13 are effective against the short-circuit.

The bent contact slit 13 is formed by connecting a slit associated with a row of pixels to a slit associated with the next row of pixels. There remains only a little area where the bent contact slit 13 can not prevent the source/drain layers 7/8 from the short-circuit. However, even if the piece of residual metal is left between any one of the gate layers 2 and the adjacent storage electrode layer 12, the bent contact slit 13 can prevent the gate/storage electrode layers 2/12 from the short-circuit.

The bent contact slits 13 only require a new photo mask replaced with the photo-mask used in the prior art fabrication process. Any additional step is not required. For this reason, the production cost is not increased.

Second Embodiment

Figure 21:
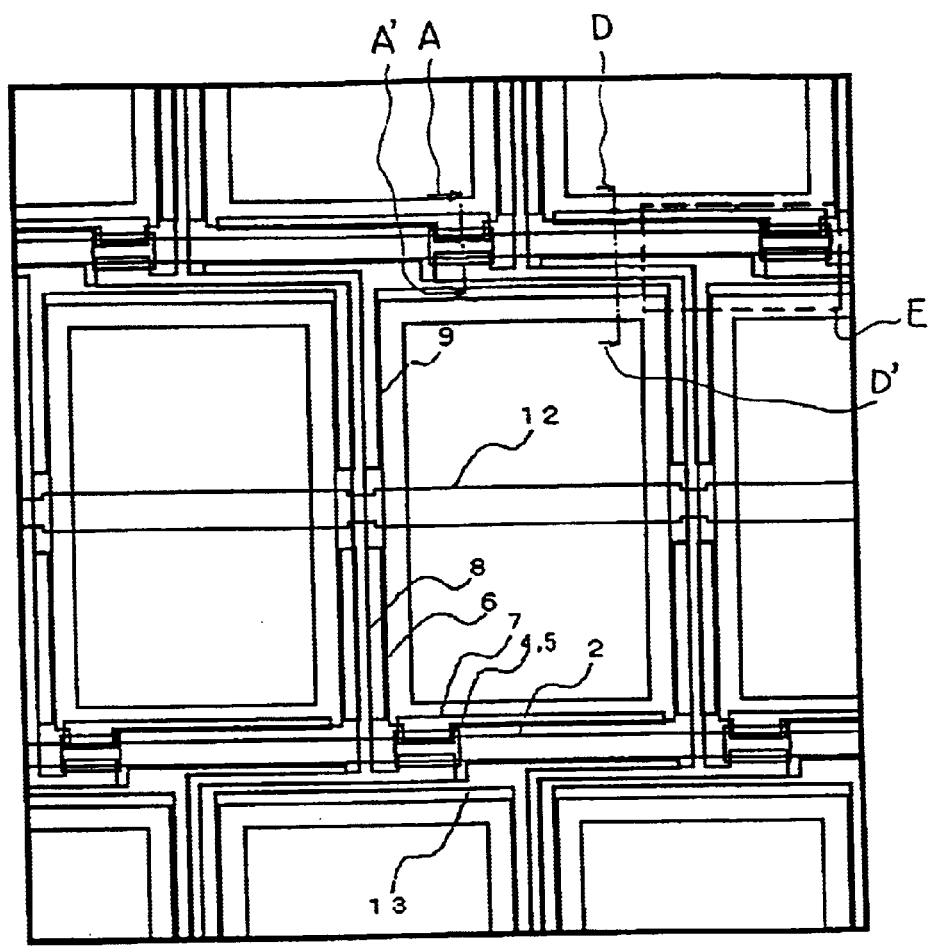
FIG. 21 is a view showing the layout of another liquid crystal display according to the present invention.
Figure 22:
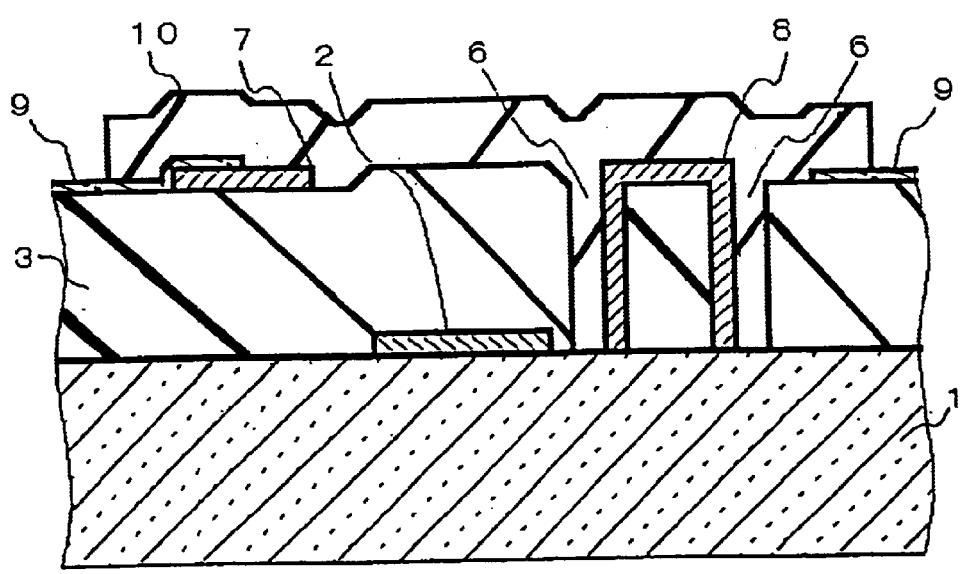
FIG. 22 is a cross sectional view taken along line D–D' of FIG. 21 and showing the structure of the liquid crystal display.
Figure 23:
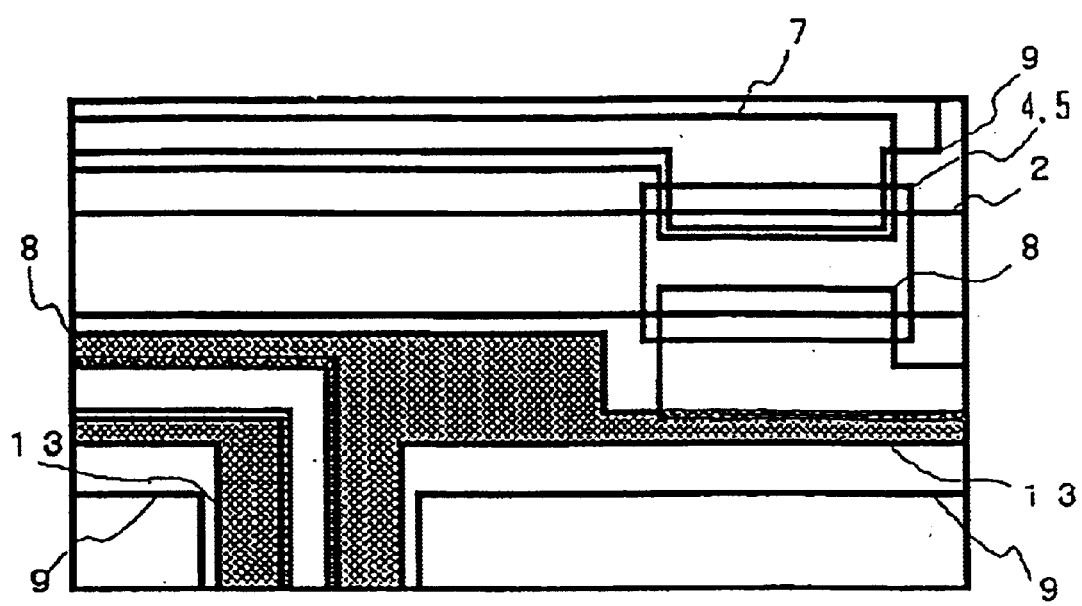
FIG. 23 is a view showing a delta pattern of the liquid crystal display encircled in broken line E.

FIG. 21 shows another thin film transistor array incorporated in a liquid crystal display. The cross section along line A–A' of FIG. 21 is similar to that of the first embodiment, and is shown in FIG. 17. FIG. 22 shows a cross section taken along line D–D' of FIG. 21. A part of the layout is encircled in broken line E, and is enlarged in FIG. 23. The pixels are also laid on the delta pattern. However, the storage electrode layers 12 pass the central areas of the rows of transparent pixel electrodes, respectively. Layers and slits of the second embodiment are labeled with the same references designating corresponding layers and slits of the first embodiment without detailed description.

The thin film transistor array is fabricated as follows. First, chromium is deposited over the entire major surface of the glass substrate 1 by using the sputtering, and the chromium layer is patterned into the gate layers 2 and the storage electrode layers 12 by using the photo-lithography followed by the etching.

Dielectric material such as $SiN_x/SiO_x$, intrinsic amorphous silicon and heavily-doped n-type amorphous silicon are successively deposited over the resultant structure by using a plasma-assisted chemical vapor deposition. The dielectric material forms the gate insulating layer 3, and the intrinsic amorphous silicon and the heavily-doped n-type amorphous silicon form an intrinsic amorphous silicon layer formed over the gate insulating layer 3 and a heavily-doped n-type amorphous silicon layer laminated on the intrinsic amorphous silicon layer, respectively. The heavily-doped n-type amorphous silicon layer and the intrinsic amorphous silicon layer are patterned into heavily-doped n-type amorphous silicon layers and the intrinsic amorphous silicon layers thereunder.

Subsequently, the gate insulating layer 3 is selectively etched away for electrical connection between the source/drain layers 7/8 to be formed and peripheral terminals (not shown). In this step, the bent contact slits 13 and the contact slits 6 are formed in the gate insulating layer 3.

The bent contact slit 13 is broken down into four sections. The first section is formed between the gate layer 2 and the region assigned to a part of the drain layer 8 in parallel to the gate layer 2. The second section is formed between the region assigned to the transparent pixel electrode 9 and a lateral line of the region assigned to the drain layer 8. The third and fourth sections are formed in regions between the transparent pixel electrode and longitudinal lines of the drain layers 8. The third and fourth sections are located between the storage electrode layer 12 and the next row of pixel electrodes. The contact slit 6 is formed between the area assigned to the transparent pixel electrode 9 and the area assigned to the drain layer 8.

Subsequently, chromium, molybdenum-tantalum or aluminum/tantalum is deposited over the entire surface of the resultant structure so as to form a single or multiple conductive layers. The single/multiple conductive layers are patterned into the source layers 7 and the drain layers 8 by using the photo-lithography and the etching.

Subsequently, conductive transparent material such as ITO is deposited over the entire surface of the resultant structure, and the conductive transparent layer is patterned into the transparent pixel electrodes 9. After the patterning, the heavily-doped n-type amorphous silicon layers and the intrinsic amorphous silicon layers are selectively etched away by using a dry etching, and channel regions of the intrinsic amorphous silicon layers are exposed to the gaps between the source layers 7 and the drain layers 8.

Finally, dielectric material is deposited over the entire surface of the resultant structure, and forms the protective dielectric layer 10.

As will be understood, the bent contact slits 13 are effective against the short-circuit between the source layers 7 and the drain layers 8 and between the gate layers 2 and the storage electrode layers 12. A piece of residual amorphous silicon is liable to be left during the patterning step for the heavily-doped n-type amorphous silicon layers, and a piece of residual metal is left during the patterning step for the gate/storage electrode layers 2/12. Even so, while the bent contact slits 13 are being formed in the gate insulating layer 3, the piece of residual amorphous silicon is split into pieces, and the piece of residual metal is exposed to the bent contact slit 13. The piece of residual metal is also broken during the patterning step for the source/drain layers 7/8. Thus, the bent contact slits 13 are effective against the short-circuit.

The bent contact slit 13 is formed by connecting a slit associated with a row of pixels to a slit associated with the next row of pixels. There remains only a little area where the bent contact slit 13 can not prevent the source/drain layers 7/8 from the short-circuit.

The bent contact slits 13 only require a new photo mask replaced with the photo-mask used in the prior art fabrication process. Any additional step is not required. For this reason, the production cost is not increased.

Although particular embodiments of the present invention have been shown and described, it will be apparent to those skilled in the art that various changes and modifications may be made without departing from the spirit and scope of the present invention. Even if the gate layers, the storage electrode layers, the drain layers and the source layers are located differently from the above-described embodiments, the manufacturer changes the root of the bend contact slit.

What is claimed is:

1. A liquid crystal display comprising
   a substrate, and
   an array of pixels arranged in a delta pattern on said substrate and including
      a thin film transistor array having
         a gate pattern having plural gate layers formed on a major surface of the substrate, a gate insulating layer covering said gate pattern and a remaining area of said major surface, amorphous silicon layers formed on said gate insulating layers over said gate layers for providing conductive channels, a source pattern having plural source layers formed on said gate insulating layer and held in contact with the associated amorphous silicon layers, respectively, and a drain pattern having plural drain layers formed on said gate insulating layer, held in contact with said associated amorphous silicon layers, respectively, and spaced from the associated source layers and from the source layers of adjacent thin film transistors of said thin film transistor array by first regions of said gate insulating layer, respectively,
      plural transparent pixel electrodes formed on said gate insulating layer and connected to said source layers, respectively, and
      storage electrode layers formed on said major surface and spaced from said gate layers by second regions of said gate insulating layer,
      contact slits being formed in said gate insulating layer and selectively extending through said first regions and said second regions so as to expose parts of said major surface under said second regions thereto, said contact slits being filled with a dielectric material;
   wherein one of said contact slits extends through a part of said gate insulating layer between one of said gate layers and an adjacent one of said plural drain layers, another part of said gate insulating layer between said adjacent one of said plural drain layers and an adjacent one of said plural storage electrode layers and yet another part of said gate insulating layer between one end portion of said part of said gate insulating layer and one end portion of said another part of said gate insulating layer opposed to said one end portion of said part.

2. The liquid crystal display as set forth in claim 1, in which said plural drain layers have respective portions extending in parallel to portions of said source layers of said adjacent thin film transistors and liable to be short circuited with said portions of said drain layers due to pieces of residual amorphous silicon.

3. The liquid crystal display as set forth in claim 2, in which said gate insulating layer is formed of an insulating material to be etched together with said amorphous silicon.

4. The liquid crystal display as set forth in claim 3, in which said insulating material is formed of $SiN_x$ and $SiO_x$.

5. The liquid crystal display as set forth in claim 1, in which said gate layers have respective portions extending in parallel to portions of said plural storage electrode layers and liable to be short circuited due to pieces of residual conductive material.

6. The liquid crystal display as set forth in claim 5, in which said plural source layers and said plural drain layers are formed of a conductive material to be etched together with said pieces of residual conductive material.

7. The liquid crystal display as set forth in claim 6, in which said conductive material is selected from the group of chromium, molybdenum-tantalum and a combination of aluminum and tantalum, and said pieces of residual conductive material is chromium.

8. The liquid crystal display as set forth in claim 1, in which said plural gate layers are partially in parallel to said plural drain layers, and said plural drain layers are partially in parallel to said plural storage electrode layers.

9. A liquid crystal display comprising:
   a substrate;
   a gate layer formed on said substrate;
   a storage electrode layer formed on said substrate;
   a gate insulating layer covering a portion of said substrate and covering said gate layer and said storage electrode layer;
   a first source layer formed on said gate insulating layer;
   a second source layer formed on said gate insulating layer; and
   a drain layer formed on said gate insulating layer and positioned between said first source layer and said second source layer and between said gate layer and said storage electrode layer;
   wherein said gate layer is positioned between said first source layer and said drain layer;
   wherein said storage electrode layer is positioned between said drain layer and said second source layer; and
   wherein a protective dielectric layer extends from a top portion of said drain layer through said gate insulating layer between said gate layer and said drain layer to contact said substrate and extends from said top portion of said drain layer though said gate insulating layer between said drain layer and said storage electrode layer to contact said substrate.

* * * * *